United States Patent
Ng et al.

(10) Patent No.: US 9,252,224 B2
(45) Date of Patent: Feb. 2, 2016

(54) SELF-ALIGNED INSULATED FILM FOR HIGH-K METAL GATE DEVICE

(71) Applicant: Taiwan Semiconductor Manufacturing Company, Ltd., Hsin-Chu (TW)

(72) Inventors: Jin-Aun Ng, Hsinchu (TW); Maxi Chang, Banciao (TW); Jen-Sheng Yang, Keelung (TW); Ta-Wei Lin, Minxiong Township (TW); Shih-Hao Lo, Zhubei (TW); Chih-Yang Yeh, Jhubei (TW); Hui-Wen Lin, Taiping (TW); Jung-Hui Kao, Hsin-Chu (TW); Yuan-Tien Tu, Puzih (TW); Huan-Just Lin, Hsinchu (TW); Chih-Tang Peng, Zhubei (TW); Pei-Ren Jeng, Chu-Bei (TW); Bao-Ru Young, Zhubei (TW); Harry-Hak-Lay Chuang, Singapore (SG)

(73) Assignee: Taiwan semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/471,293

(22) Filed: Aug. 28, 2014

(65) Prior Publication Data
US 2014/0367802 A1    Dec. 18, 2014

Related U.S. Application Data

(62) Division of application No. 13/244,365, filed on Sep. 24, 2011, now Pat. No. 8,822,283.

(60) Provisional application No. 61/530,845, filed on Sep. 2, 2011.

(51) Int. Cl.
*H01L 29/76* (2006.01)
*H01L 29/423* (2006.01)
(Continued)

(52) U.S. Cl.
CPC .. *H01L 29/42364* (2013.01); *H01L 21/823807* (2013.01); *H01L 21/823842* (2013.01); *H01L 21/823864* (2013.01); *H01L 29/4958* (2013.01); *H01L 29/517* (2013.01); *H01L 29/518* (2013.01); *H01L 29/6659* (2013.01);
(Continued)

(58) Field of Classification Search
CPC ..... H01L 29/49; H01L 29/517; H01L 21/318; H01L 29/511; H01L 21/02172; H01L 29/6659; H01L 29/7833
USPC ......... 438/786, 778, 211, 216, 287, 769, 768; 257/649, 411
See application file for complete search history.

(56) References Cited

U.S. PATENT DOCUMENTS

| 4,954,867 A | 9/1990 | Hosaka |
| 7,214,990 B1 | 5/2007 | Lee et al. |

(Continued)

OTHER PUBLICATIONS

Korean Office Action Issued in Patent Application No. 10-2015-0063023 filed May 6, 2015.

*Primary Examiner* — Thanh Y Tran
(74) *Attorney, Agent, or Firm* — Haynes and Boone, LLP

(57) ABSTRACT

An integrated circuit includes a semiconductor substrate, a gate dielectric over the substrate, a metal gate structure over the semiconductor substrate and the gate dielectric, a dielectric film on the metal gate structure, the dielectric film comprising oxynitride combined with metal from the metal gate, and an interlayer dielectric (ILD) on either side of the metal gate structure.

20 Claims, 9 Drawing Sheets

(51) Int. Cl.
*H01L 21/8238* (2006.01)
*H01L 29/49* (2006.01)
*H01L 29/51* (2006.01)
*H01L 21/28* (2006.01)
*H01L 29/66* (2006.01)

(52) U.S. Cl.
CPC ..... *H01L21/28079* (2013.01); *H01L 21/28088* (2013.01); *H01L 29/66545* (2013.01)

(56) References Cited

U.S. PATENT DOCUMENTS

| | | |
|---|---|---|
| 7,667,273 B2 | 2/2010 | Koyama et al. |
| 7,888,195 B2 | 2/2011 | Lin et al. |
| 2003/0098487 A1* | 5/2003 | Ngo et al. ............ 257/382 |
| 2007/0037343 A1 | 2/2007 | Colombo et al. |
| 2008/0057690 A1* | 3/2008 | Forbes et al. ........ 438/593 |
| 2008/0157365 A1 | 7/2008 | Ott et al. |
| 2008/0242012 A1 | 10/2008 | Pae et al. |
| 2008/0268588 A1 | 10/2008 | Anderson et al. |
| 2009/0174002 A1* | 7/2009 | Ouyang et al. ........ 257/369 |
| 2010/0084719 A1* | 4/2010 | Masuoka et al. ...... 257/411 |
| 2011/0006354 A1 | 1/2011 | Jangjian et al. |
| 2011/0156107 A1* | 6/2011 | Bohr et al. .......... 257/288 |
| 2012/0273901 A1* | 11/2012 | Yin et al. ............ 257/410 |
| 2013/0032900 A1* | 2/2013 | Hou ............ H01L 29/517 257/411 |
| 2013/0056837 A1 | 3/2013 | Ng et al. |

\* cited by examiner

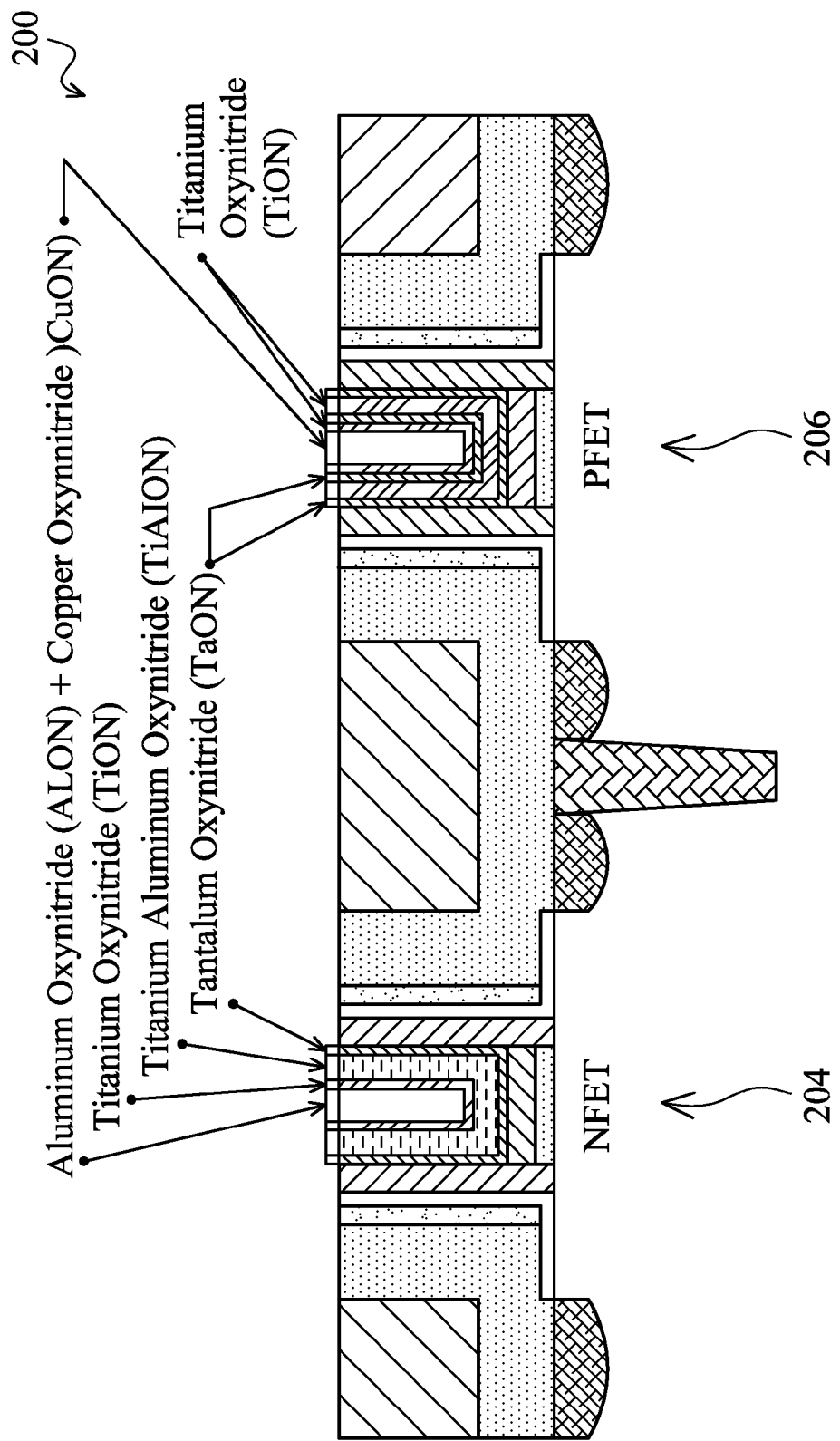

SELF-ALIGNED INSULATED FILM FOR HIGH-K METAL GATE DEVICE

This is a divisional of U.S. patent application Ser. No. 13/244,365 filed Sep. 24, 2011, which claims the benefit of provisional application Ser. No. 61/530,845 filed Sep. 2, 2011, each of which is hereby incorporated by reference in its entirety.

BACKGROUND

Semiconductor device fabrication includes many different processes, each process having associated cycle-time and cost requirements. It is a continued desire to reduce cost and cycle-time in device fabrication. Further, it is a continued desire to reduce the number of defects and improve yields in semiconductor fabrication. One area for improvement is the fabrication of metal-oxide-semiconductor field-effect transistor (MOSFET) devices having a high dielectric constant (high-k) metal gate. The present disclosure provides improvements that relate to the fabrication of such devices.

SUMMARY

The present disclosure provides many different embodiments of methods for making integrated circuit devices. In one embodiment, a method of making an integrated circuit includes providing a semiconductor substrate and forming a gate dielectric over the substrate, such as a high-k dielectric. A metal gate structure is formed over the semiconductor substrate and the gate dielectric and a thin dielectric film is formed over that. The thin dielectric film includes oxynitride combined with metal from the metal gate. The method further includes providing an interlayer dielectric (ILD) on either side of the metal gate structure.

In another embodiment, a method for making an integrated circuit includes providing a substrate with a high-k dielectric and providing a polysilicon gate structure over the high-k dielectric. A hardmask is formed on a top surface of the polysilicon gate structure and sidewall structures on side surfaces of the polysilicon gate structure. After forming the hardmask, a doping process is performed on the substrate adjacent to the polysilicon gate structure. After the doping processes, the hard mask and the polysilicon gate structure are removed, keeping at least a portion of the sidewall structures to form a trench. The trench is filled with at least one metal material to form a metal gate, such as copper, aluminum, titanium, and/or tantalum. A thin dielectric layer is then formed on and self aligned with a top surface of the metal gate, the thin dielectric layer including the metal material.

The present disclosure also provides many different embodiments of integrated circuit devices. In one embodiment, an integrated circuit includes a semiconductor substrate and a gate dielectric over the substrate, such as a high-k dielectric. A metal gate structure is over the semiconductor substrate and the gate dielectric, and a dielectric film is on the metal gate structure. The dielectric film includes oxynitride combined with metal from the metal gate. An interlayer dielectric (ILD) is on either side of the metal gate structure.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Also, several elements and features are shown in the figures, not all of which are numbered for the sake of clarity. It is understood, however, that symmetrical features and items will be similarly situated.

DETAILED DESCRIPTION

Figure 1:
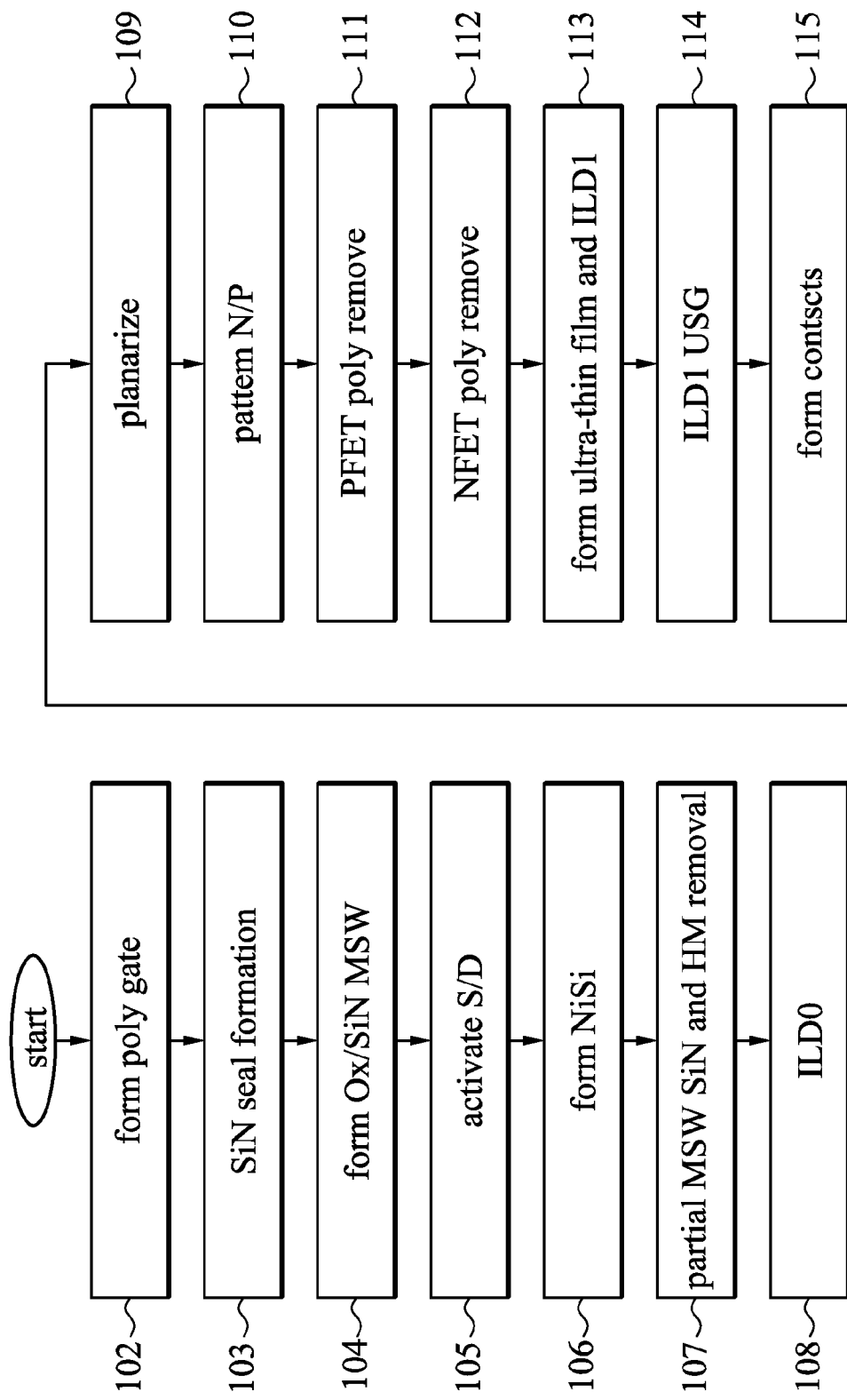
FIG. 1 is a flowchart of a method of making the semiconductor device having a metal gate stack according to one embodiment of the present invention.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of a method 100 for making a semiconductor device according to one embodiment. The semiconductor device includes an n-type field-effect transistor (NFET) and a p-type field-effect transistor (PFET), both with a metal gate stack resistor constructed according to various aspects of the present disclosure. FIGS. 2 through 15 are sectional views of a semiconductor structure 200 at various fabrication stages and constructed according to one or more embodiments. The semiconductor structure 200 and the method 100 of making the same are collectively described with reference to FIGS. 1 through 16.

Figure 2:
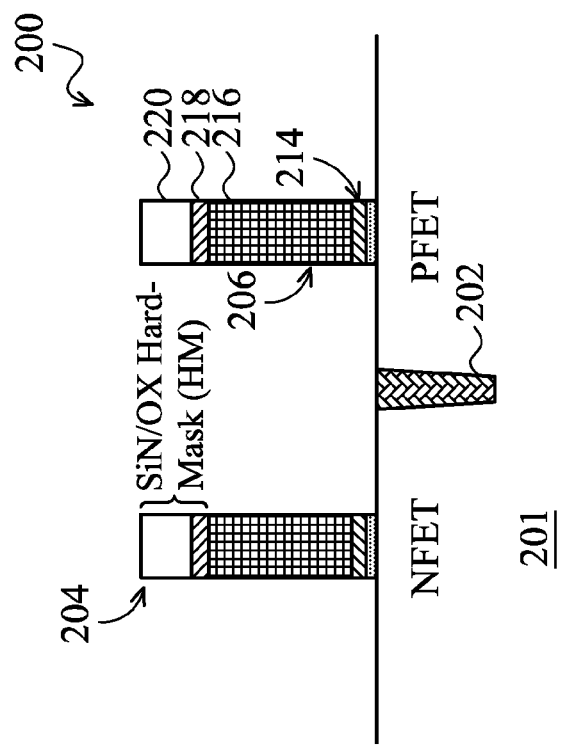

Referring to FIGS. 1 and 2, the method 100 begins at step 102 by providing a semiconductor substrate 201 on which to form a polysilicon gate. The semiconductor substrate 201 includes silicon. Alternatively, the substrate includes germanium, silicon germanium or other proper semiconductor materials. The semiconductor substrate also includes various doped regions such as n-well and p-wells. The semiconductor substrate 201 includes an isolation feature such as shallow trench isolation (STI) 202 formed in the substrate to separate NFET and PFET transistors. The formation of the STI feature includes etching a trench in a substrate and filling the trench by one or more insulator materials such as silicon oxide, silicon nitride, or silicon oxynitride. The filled trench may have a multi-layer structure such as a thermal oxide liner layer with silicon nitride filling the trench. In one embodiment, the STI feature 202 is created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure. The semiconductor substrate 201 also includes various n-wells and p-wells formed in various active regions.

Two similar polysilicon gate stacks 204, 206 are formed on the substrate 201, on either side of the STI structure 202. In the present embodiment, each polysilicon gate stack 204, 206 includes (viewed in the figure from the substrate 201 up), a silicon oxide interfacial layer (IL), a high-k dielectric layer (HK) and a cap layer, generally designated with the reference number 214. In various embodiments, the interfacial layer may be formed by chemical oxide technique, thermal oxide procedure, atomic layer deposition (ALD) or chemical vapor deposition (CVD). The high k dielectric material layer may be formed by CVD, ALD, plasma enhanced CVD (PE CVD), or plasma enhanced ALD (PEALD). The cap layer can be formed using CVD with precursor silane ($SiH_4$) or other silicon based precursor.

Continuing with the present embodiment, a polycrystalline silicon (polysilicon) layer 216 is formed above the IL/HK/Cap layer 214. In the present embodiment, the polysilicon layer 216 is non-doped. The silicon layer 216 alternatively or additionally may include amorphous silicon. An oxide 218 is formed over the polysilicon layer 216, and a silicon nitride layer (SiN) 218 is formed over it, forming a hard mask (HM). It is understood that the formation, including patterning, of such layers is well known in the art, and will not be further discussed for the sake of brevity and clarity.

Figure 3:
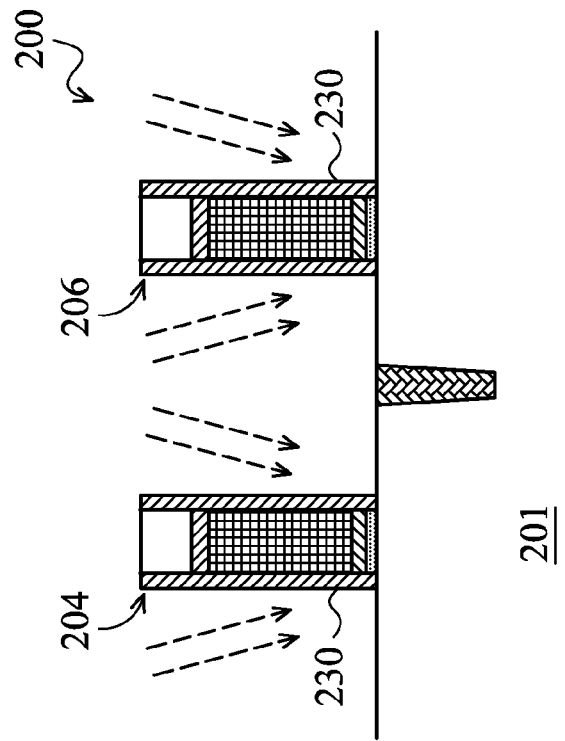
FIGS. 2-15 are sectional views of one embodiment of a semiconductor device having an n-type and p-type MOSFET (an NFET and PFET) with metal gate stacks, at various fabrication stages constructed according to the method of FIG. 1.

Referring to FIGS. 1 and 3, the method 100 proceeds to step 103, where a SiN seal 230 is formed around the gate stacks 204, 206. In the present embodiment, the SiN seal 230 is formed using atomic layer deposition to form a layer of approximately 50 A thickness. In addition, the substrate 201 is doped to form halogen and light doped drain (LDD) regions for the source and drain (S/D) features. The source and drain regions are formed for the NFET and the PFET devices using proper doping species.

Figure 4:
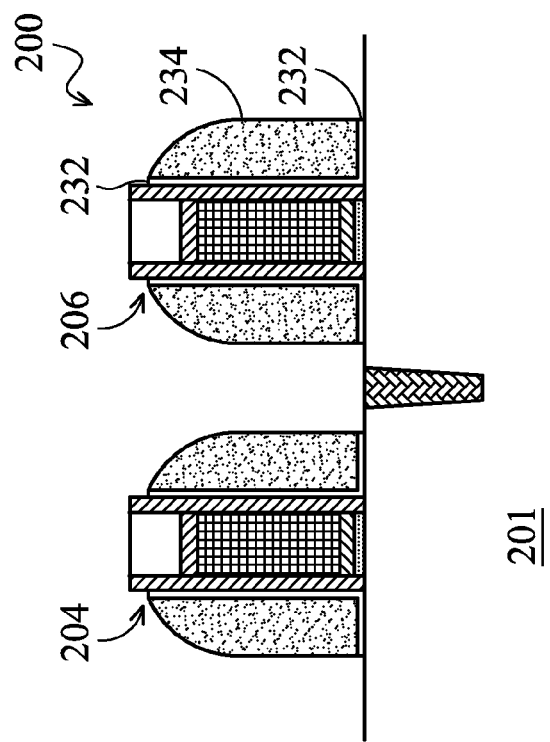

Referring to FIGS. 1 and 4, the method 100 proceeds to step 104, where a main side wall (MSW) is formed. The MSW includes an oxide (OX) layer 232 adjacent to the outer surface of the SiN layer 230 and the upper surface of the substrate 201. In the present embodiment, the OX layer 232 is formed by ALD to a thickness of about 30 A. The MSW also includes SiN sidewalls 234 formed on an outer surface of the OX layer 232. The SiN layer is formed to a maximum thickness of about 250 A. As shown in FIG. 4, the MSW is adjacent to the sidewalls of the polysilicon gate stacks 204, 206, and do not cover the entire substrate.

Figure 5:
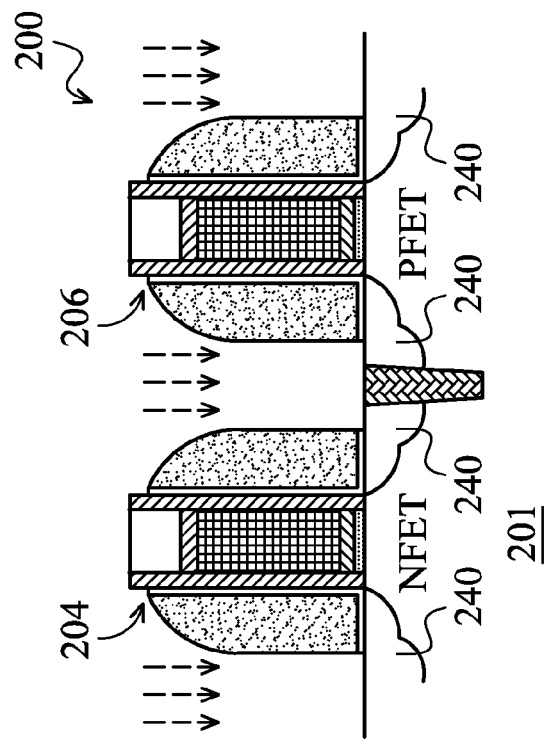

Referring to FIGS. 1 and 5, the method 100 proceeds to step 105, where S/D and electrostatic discharge regions 240 are fully implanted and activated. As mentioned above with respect to step 103, LDD regions were previously provided in the substrate 201 prior to the MSW being formed at step 104. At step 105, a deeper implantation process is performed. The doped regions for the NFET are doped with P-type dopants, such as boron or BF2, and the doped regions for the PFET are doped with N-type dopants, such as phosphorus or arsenic. The doped regions 240 may be formed directly on the substrate 201, in a P-well structure, in an N-well structure, in a dual-well structure, or using a raised structure. In the present embodiment, the S/D activation is performed by a laser anneal (LSA) at about 1150 C, along with a rapid thermal anneal (RTA) with about a 1010 C spike.

Figure 6:
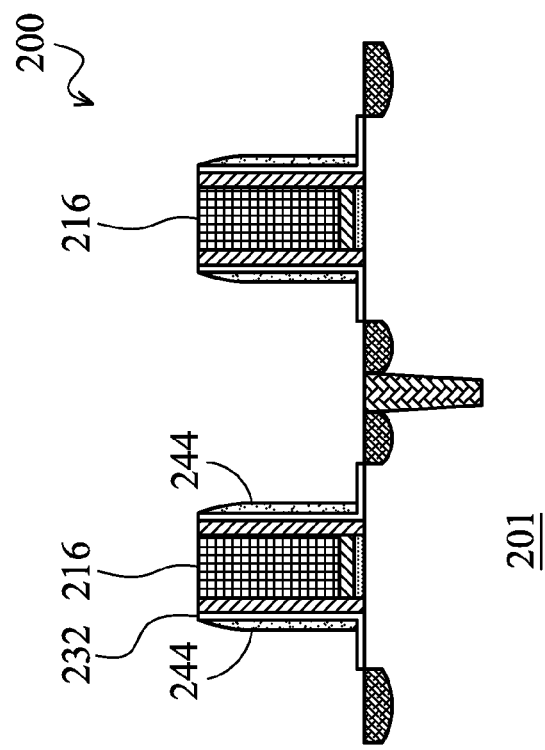

Referring to FIGS. 1 and 6, the method 100 proceeds to step 106, in which Nickel silicide (NiSi) regions 242 are formed for future contacts to the S/D regions 240. In the present embodiment, Ni is deposited to a thickness of about 400 A in the substrate 201, guided by the MSW formed at step 105.

Figure 7:
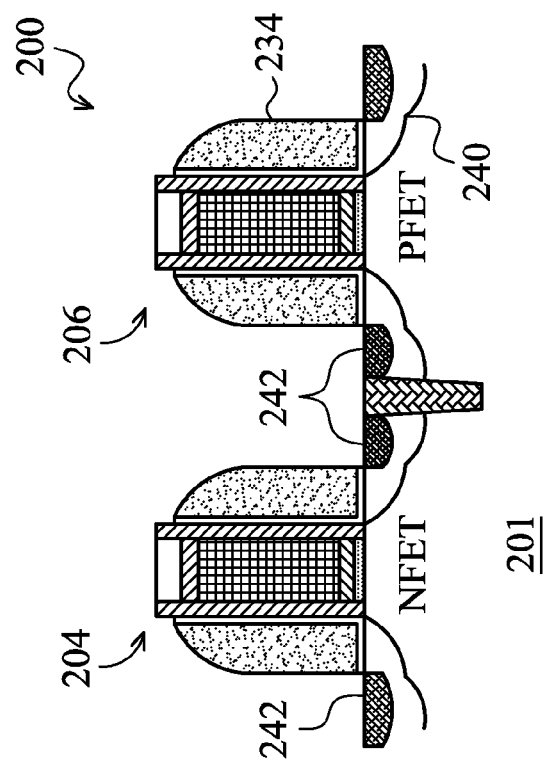

Referring to FIGS. 1 and 7, the method 100 proceeds to step 107, in which a portion of the SiN layer 234 of the MSWs is removed from the two gate stacks. As shown in FIG. 7, a portion of the SiN layer, now labeled 244, remains on the MSWs, as well as the OX layer 232. In the present embodiment, this removal process is performed by a wet etch using $H_3PO_4$ at about 120 C. In addition, the HM 218, 220 is removed from the top portion of the polysilicon gate 216. In the present embodiment, the SiN and OX HM is removed by a dry etch process.

Figure 8:
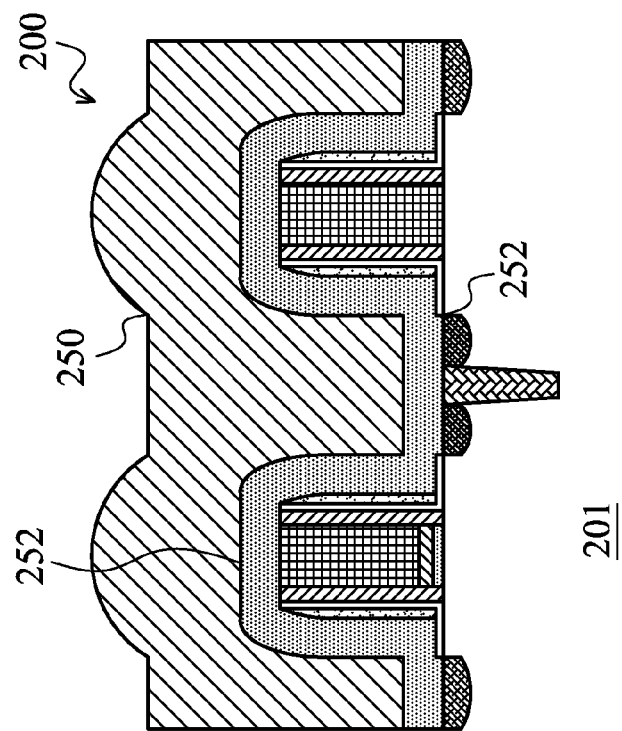

Referring to FIGS. 1 and 8, the method 100 proceeds to step 108, in which an interlayer dielectric (ILD) layer 250 is formed over the two gate stacks 204, 206. In the present embodiment, a tensile SiN contact etch stop layer 252 is deposited first, to a thickness of about 200 A. Thereafter, the ILD layer 250, phosphate silicate glass (PSG) in the present embodiment, is deposited to a thickness of about 2000 A using and ion plasma (IPM).

Figure 9:
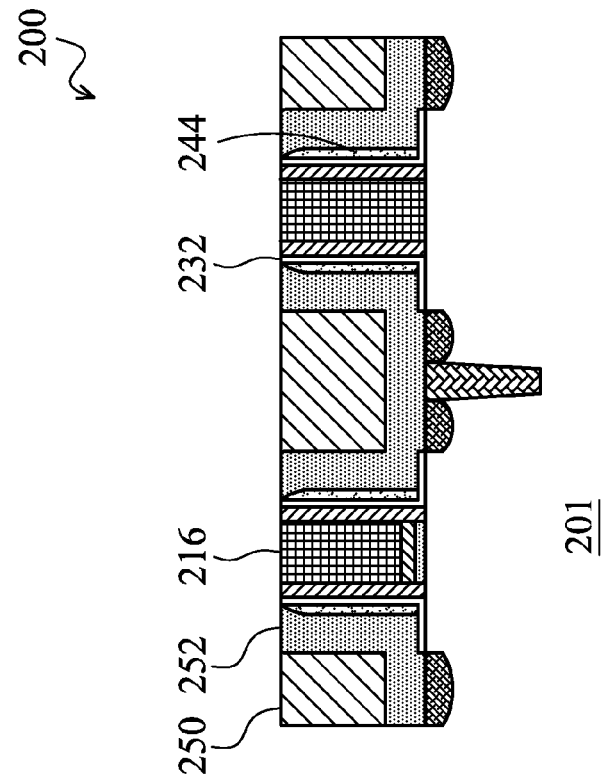

Referring to FIGS. 1 and 9, the method 100 proceeds to step 109, in which the upper surface of the device is planarized to expose the polysilicon gates 216. In the present embodiment, a chemical mechanical polishing process is performed.

Figure 10:
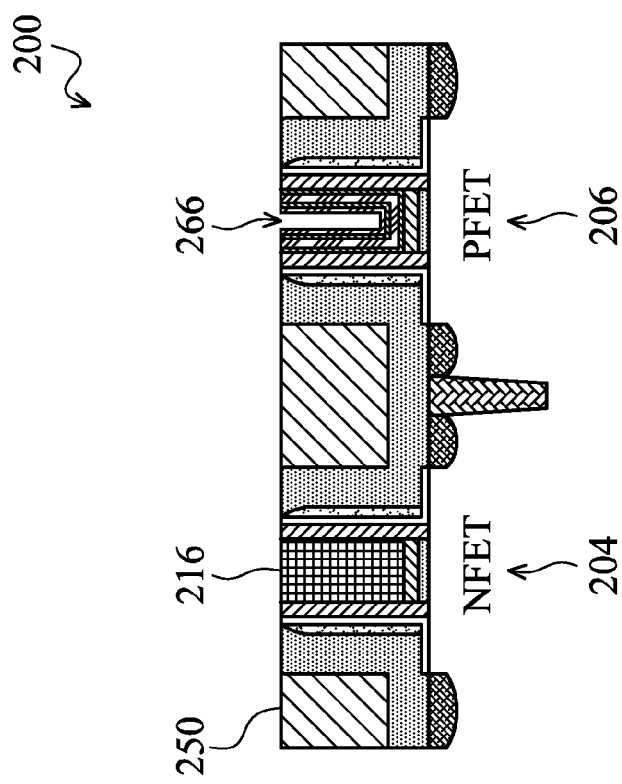

Referring to FIGS. 1 and 10, the method 100 proceeds to step 110, in which one of the two polysilicon gate stacks 204, 206 is masked. In the present embodiment, the polysilicon mask 216 for the NFET gate stack 204 is masked with a patterned photoresist (PR) layer 260. Specifically, a 20 A TiN hard mask 262 is deposited over a top surface of the device, and then the PR layer 260 is deposited over it. The PR layer 260 is patterned to mask the NFET gate stack 204.

Figure 11:
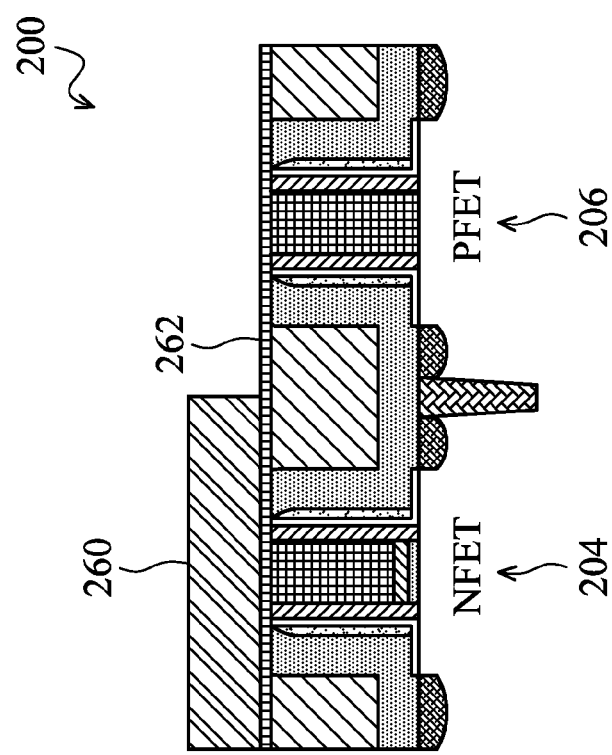

Referring to FIGS. 1 and 11, the method 100 proceeds to step 111, the polysilicon 216 in the PFET gate stack 206 is removed. In the present embodiment, the polysilicon 216 is removed via etching from the PFET gate stack 206 (which is now more accurately described as a trench than a gate stack), while the polysilicon in the NFET gate stack remains intact for being shielded by the patterned PR 260 in FIG. 10. Afterwards, a metal gate 266 is formed in the trench remaining from the removed polysilicon 216 in the PFET gate stack 206. The metal gate can be formed of one or more layers, and in the present embodiment, include the following deposited metals in order: TaN, TiN, TaN, TiN and Al (with trace amounts of Cu). The deposited metal layers cover the entire surface of the device 200, but are then removed, including the PR 260, by a CMP process.

Figure 12:
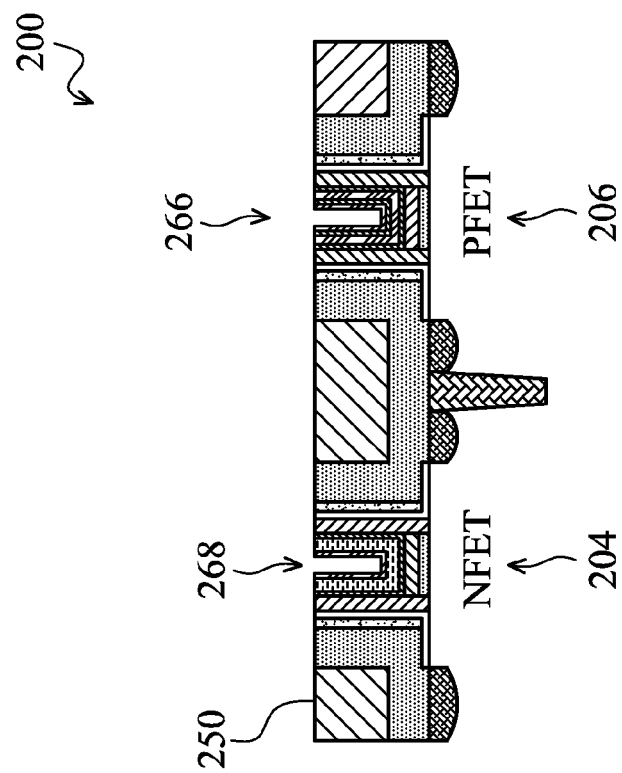

Referring to FIGS. 1 and 12, the method 100 proceeds to step 112, in which a similar process is repeated on the NFET gate stack 204. In the present embodiment, since the polysilicon has already been removed and replaced on the PFET gate stack 206, a patterned PR layer covering the PFET gate stack is not used. The polysilicon 216 is removed from the NFET gate stack 204, such as by an etch process. Afterwards, a metal gate 268 is formed in the trench remaining from the removed polysilicon 216 in the NFET gate stack 204. The metal gate 268 can be formed of one or more layers, and in the present embodiment, include the following deposited metals in order: TaN, TiAl, TiN and Al (with trace amounts of Cu). The deposited metal layers cover the entire surface of the device 200, but are then removed, including the PR 260, by a CMP process. As a result, both of the polysilicon gate stacks are now metal gate stacks 204, 206.

Figure 13A:
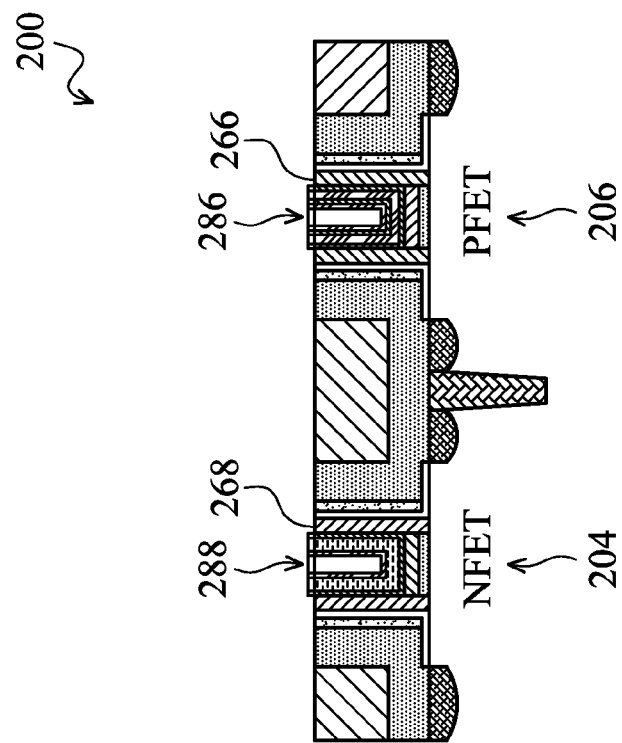

Referring to FIGS. 1, 13a, and 13b, the method 100 proceeds to step 113, in which ultra-thin metal oxynitride films 288, 286 are formed on the top surface of the metal gate stacks 204, 206, respectively. In one embodiment, an oxygen plasma at 20 C, 900 W, 60 sec, with O2, is bombarded onto the surface. Afterwards, an Ammonia plasma at 400 C, 75 W, 60 sec, with NH3/N2, is bombarded onto the surface. In an alternative embodiment, a nitrogen plasma (without NH3) can be used. The result is an ultra-thin metal oxynitride film, with a thickness of about 1 nm to about 10 nm. The oxynitride films only react with the metal materials (e.g., Ti, Ta, Cu, Al, TiAl) in the gate stacks 204, 206, thereby making the process self-aligned.

Figure 14:
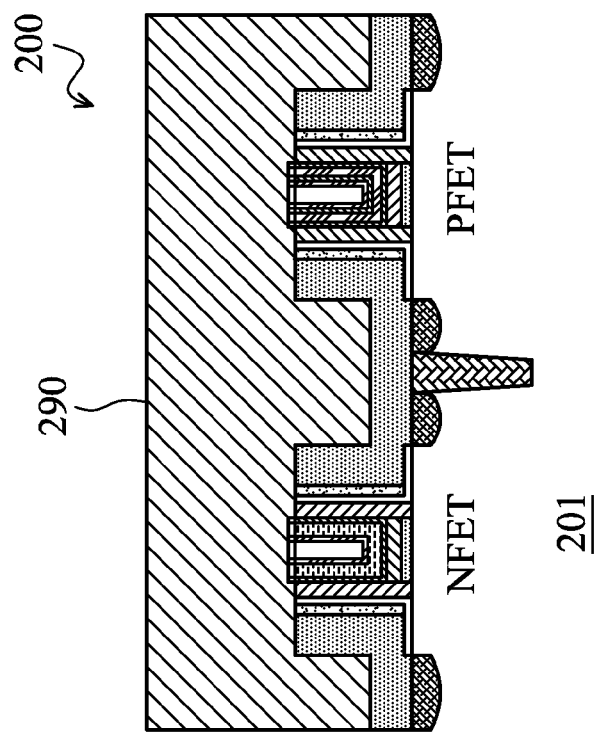

Referring to FIGS. 1 and 14, the method 100 proceeds to step 114, in which an ILD 290 is formed over the metal gate stacks 204, 206, including the ultra-thin metal oxynitride films 288, 286. In the present embodiment, the ILD 290 is undoped silicate glass (USG) at a thickness of about 1450 A. The USG 290 is formed by a deposition process at 400 C using SiH4/N2O/He. The USG 290 can be formed on top of the PSG 250, or the PSG 250 can be removed, and/or a additional combinations of dielectric materials can be formed.

Figure 15:
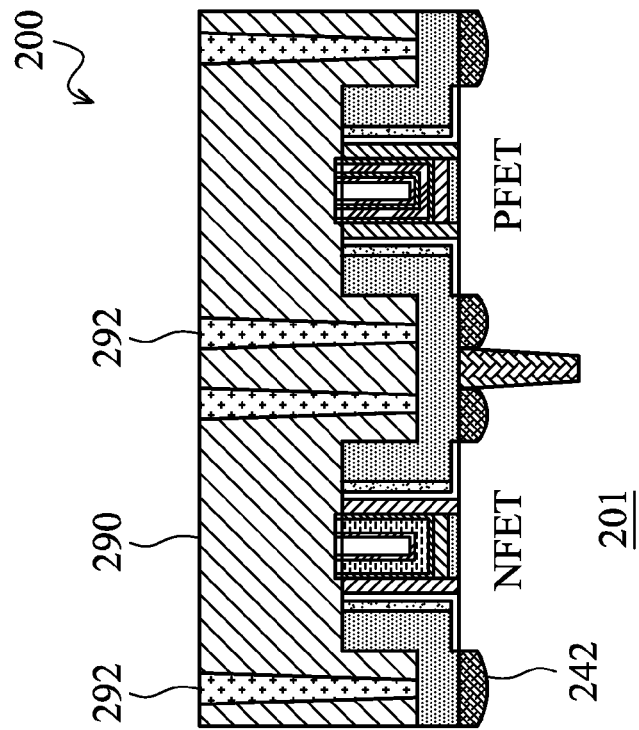

Referring to FIGS. 1 and 15, the method 100 proceeds to step 115, contact are formed for electrical connection to the S/D regions of the NFET and PFET transistors. In the present embodiment, contact openings are patterned and etched in the ILD 290, and then filled with W plugs 292. The upper surface of the device is planarized by CMP, resulting in the device as shown in the Figure. From there with back end of line processing.

The present embodiments discussed above provides many benefits, it being understood that other embodiments may not have the same benefits. The benefits of the embodiments discussed above include improved reliability due to the plasma-induced ultra-thin insulator layer, as opposed to alternative methods for forming such a layer. Also, chip-level cell stress is improved. Further, yield improvement and reduced shorts are provided by transforming any metal residue (e.g., Al, Cu, Ti, or Ta) into the metal oxynitride.

The present disclosure is not limited to applications in which the semiconductor structure includes a FET (e.g. MOS transistor) and may be extended to other integrated circuit having a metal gate stack. For example, the semiconductor structures may include a dynamic random access memory (DRAM) cell, an imaging sensor, a capacitor and/or other microelectronic devices (collectively referred to herein as microelectronic devices). In another embodiment, the semiconductor structure includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit, comprising:
    a semiconductor substrate;
    a gate dielectric over the substrate;
    a metal gate structure over the semiconductor substrate and the gate dielectric, the metal gate structure including a first portion comprising a first metal and a second portion comprising a second metal that is different than the first metal;
    a dielectric film on the metal gate structure, the dielectric film including a first metal oxynitride substantially aligned with and directly on the first portion of the gate structure and comprising the first metal, the dielectric film further comprising a second metal oxynitride substantially aligned with and directly on the second portion of the gate structure and comprising the second metal;
    an interlayer dielectric (ILD) on either side of the metal gate structure.

2. The integrated circuit of claim 1, wherein the gate dielectric is a high-k dielectric and has a thickness less than about 10 nm.

3. The integrated circuit of claim 1, wherein the metal gate structure includes a third portion comprising a third metal different from the first metal and the second metal, and wherein the dielectric film further includes a third metal oxynitride aligned with the third metal.

4. The integrated circuit of claim 1, wherein the first metal includes copper and the dielectric film includes copper oxynitride.

5. The integrated circuit of claim 4, wherein the second metal includes at least one from the group consisting of titanium, tantalum, and aluminum.

6. The integrated circuit of claim 5, wherein the dielectric film further includes at least one from the group consisting of titanium oxynitride, tantalum oxynitride, aluminum oxynitride, and titanium aluminum oxynitride.

7. The integrated circuit of claim 1, wherein the metal gate structure includes copper and titanium.

8. The integrated circuit of claim 7, wherein the dielectric film combines with the copper to form copper oxynitride and with the titanium to form titanium oxynitride.

9. An integrated circuit comprising:
    a semiconductor substrate;
    a gate dielectric over the substrate;
    a metal gate structure over the semiconductor substrate and the gate dielectric, the metal gate structure comprising a first portion comprising a first metal and a second portion comprising a second metal that is different than the first metal;
    a thin dielectric film on the metal gate structure, the thin dielectric film comprising a first region substantially aligned with the first portion, the first region comprising a first metal oxynitride having a same type of metal as the first metal, the thin dielectric film further comprising a second region substantially aligned with the second portion, the second region comprising a second metal oxynitride having a same type of metal as the second metal; and
    an interlayer dielectric (ILD) on either side of the metal gate structure.

10. The integrated circuit of claim 9, wherein the gate dielectric is a high-k dielectric.

11. The integrated circuit of claim 9, wherein the metal gate structure includes copper and titanium.

12. The integrated circuit of claim 9, wherein the thin dielectric layer has a thickness less than about 10 nm.

13. The integrated circuit of claim 9, wherein the metal gate structure includes at least two from the group consisting of copper, titanium, tantalum, and aluminum.

14. The integrated circuit of claim 13, wherein the thin dielectric film includes at least two from the group consisting of copper oxynitride, titanium oxynitride, tantalum oxynitride, aluminum oxynitride, and titanium aluminum oxynitride.

15. An integrated circuit, comprising:
a substrate with a high-k dielectric;
a trench between two sidewall structures;
a metal gate disposed within the trench, the metal gate comprising a first metal material and a second metal material that is different than the first metal material;
a thin dielectric layer on and substantially aligned with a top surface of the metal gate, the thin dielectric layer including a first metal oxynitride comprising the first metal material and a second metal oxynitride comprising the second metal material, wherein the first metal oxynitride is directly on a first portion of the metal gate and the second metal oxynitride is directly on a second portion of the metal gate.

16. The integrated circuit of claim 15, wherein the fit metal material includes copper and the first metal oxynitride of the thin dielectric layer includes copper oxynitride.

17. The integrated circuit of claim 15, wherein the first metal material and the second metal material include at least two from the group consisting of copper, titanium, tantalum, and aluminum.

18. The integrated circuit of claim 17, wherein the thin dielectric layer includes at least two from the group consisting of copper oxynitride, titanium oxynitride, tantalum oxynitride, aluminum oxynitride, and titanium aluminum oxynitride.

19. The integrated circuit of claim 15, wherein the thin dielectric layer has a thickness less than about 10 nm.

20. The integrated circuit of claim 15, wherein the metal gate comprises copper and titanium and the thin dielectric layer comprises copper oxynitride and titanium oxynitride.

* * * * *